United States Patent [19]

Nakano et al.

[11] Patent Number: 4,806,795

[45] Date of Patent: Feb. 21, 1989

[54] TRANSFER GATE CIRCUIT PROTECTED FROM LATCH UP

[75] Inventors: Masao Nakano, Kasugai; Tsuyoshi Ohira, Kawasaki; Hidenori Nomura, Yokohama, all of Japan

[73] Assignees: Fujitsu Limited, Kanagawa; Fujitsu Vlsi Limited, Aichi, both of Japan

[21] Appl. No.: 97,557

[22] Filed: Sep. 16, 1987

[30] Foreign Application Priority Data

Sep. 19, 1986 [JP] Japan .................................. 61-219837

[51] Int. Cl.⁴ .................... H03K 17/16; H03K 19/096; H03K 17/687
[52] U.S. Cl. ..................................... 307/452; 307/443; 307/572; 307/576
[58] Field of Search ................. 307/443, 448, 451–452, 307/571–572, 576

[56] References Cited

U.S. PATENT DOCUMENTS 4,563,599  1/1986  Donoghue et al. .................. 307/448

OTHER PUBLICATIONS

IBM Tech. Disc. Bul. "Logic Gate" Cole et al.

Primary Examiner—John S. Heyman
Assistant Examiner—M. R. Wambach
Attorney, Agent, or Firm—Armstrong, Nikaido, Marmelstein & Kubovcik

[57] ABSTRACT

A transfer gate circuit including a first MIS transistor which transmits an input signal supplied from an input side thereof to an output side thereof in accordance with a control signal supplied to a gate of the first MIS transistor; an inverter circuit connected between power supply lines which inverts the potential of the transmitted input signal; and an output level guarantee circuit comprising second and third MIS transistors which have conductivity type opposite to that of the first MIS transistor and are connected in series between one of the power supply lines and the output side, an output signal of the inverter circuit being supplied to a gate of the second MIS transistor, an inverted signal of the control signal supplied to the gate of the first MIS transistor being supplied to a gate of the third MIS transistor.

10 Claims, 3 Drawing Sheets

TRANSFER GATE CIRCUIT PROTECTED FROM LATCH UP

BACKGROUND OF THE INVENTION (1) Field of the Invention

The present invention relates to a transfer gate circuit for reliably transferring an input signal supplied from an input side thereof to an output side thereof in accordance with a control signal supplied to a gate of a single transfer gate transistor.

(2) Description of the Related Art

Generally, a transfer gate circuit of this kind comprises CMOS type transfer gate transistors including a P-channel type transistor and an N-channel type transistor connected in parallel. The gates of the P-channel type transistor and the N-channel type transistor are supplied with a control clock signal and its inverted signal, respectively. When the above pair of transistors are turned on in accordance with the potential levels of the control clock signal and its inverted signal supplied thereto, an input signal supplied to the input side of the CMOS type transfer gate transistors is transferred to the output side thereof.

Here, the reason why the transfer gate circuit comprises the above pair of transistors constructed in the CMOS form, is that if the transfer gate were comprised only of the P-channel transistor, in the low level (zero level) state of the input signal, the potential of the output side would not fall below the threshold voltage of the P-channel transistor and if the transfer gate were comprised only of the N-channel transistor, in the high level (e.g., $V_{CC1}$ level) state of the input signal, the potential of the output side would not rise above the value of the high level potential of the inverted control clock signal minus the threshold voltage of the N-channel transistor. On the other hand, by constructing the transfer gate in the above CMOS form, the low level and high level of the input signal can be transferred as they are to the output side in accordance with the potential level of the control clock signal. Note that the above high level potential $V_{CC1}$ of the input signal is produced through an inverter circuit, for example.

When the above pair of CMOS transistors are formed in a P-type substrate, for example, source and drain regions of the N-channel transistor are formed in the above P-type substrate, and also, source and drain regions of the P-channel transistor are formed in an N-type well formed in the P-type substrate. The input signal having the potential $V_{CC1}$ in the high level side is supplied to one of the source (drain) regions of each of the N-channel and the P-channel transistors, and the above input signal is taken out as the output signal from the other source (drain) region of each of the N-channel and the P-channel transistors. Note that the N-type well in which the P-channel transistor is formed is supplied with a predetermined potential $V_{CC2}$ (as mentioned later, which is lower than $V_{CC1}$) from a power supply line which is common with the above inverter circuit.

As mentioned above, the N-type well in which is formed the P-channel transistor comprising the CMOS type transfer gate is supplied with the predetermined potential $V_{CC2}$ from the power supply line which is common with a circuit for production of the input signal to be transferred (e.g., the inverter circuit), but the power supply line inevitably includes a wiring resistance. Particularly, if some circuits belonging to another system, for example, are provided between the inverter circuit and the above transfer gate transistors, the length of the power supply line between the inverter circuit and the transfer gate transistors becomes relatively long, and thus, the value of the wiring resistance due to the above length of the power supply line becomes relatively high. Further when the power current is supplied to some peripheral circuits provided on the same substrate through the power supply line, the value of the power current flowing through the power supply line also becomes high. Therefore, in such a case, a relatively large potential difference occurs between the potential $V_{CC1}$ supplied from the power supply line to the inverter circuit and the potential $V_{CC2}$ supplied from the power supply line to the N-type well. The potential $V_{CC2}$ therefore becomes lower than the potential $V_{CC1}$ (that is, $V_{CC1} > V_{CC2}$).

On the other hand, as a current (i.e., the input signal) flowing through a signal line is small, the high level potential of the input signal supplied to the transfer gate transistors is nearly equal to the high level potential $V_{CC1}$ supplied from the inverted circuit, so in the high level state of the input signal, a PN junction turns on between the source (drain) of the P-channel transistor to which the potential $V_{CC1}$ is supplied and the N-type well to which the potential $V_{CC2}$ is supplied. Due to this, there is a chance of occurrence of so-called latch-up by the thyrister equivalently comprised by the PNPN layers formed in the above P-type semiconductor substrate. In such a case, subsequent to this, there is the problem that current will continue to flow in the semiconductor substrate through the PNPN layers.

SUMMARY OF THE INVENTION

The present invention was made to solve this problem. The main object of the present invention is to provide the transfer gate circuit which inhibits the chance of occurrence of latch-up as in the above conventional CMOS type transfer gate circuit and further enables reliable transfer of the input signal supplied from the input side thereof to the output side thereof in accordance with the potential level of the control clock signal supplied to a gate of a single transfer gate transistor.

To solve the above-mentioned problem, the present invention provides a transfer gate circuit comprising a first MIS transistor which transmits an input signal supplied from an input side thereof to an output side thereof in accordance with a control signal supplied to a gate of the first MIS transistor; an inverter circuit connected between power supply lines which inverts the potential of the transmitted input signal; and an output level guarantee circuit comprising second and third MIS transistors which have a conductivity type opposite to that of the first MIS transistor and are connected in series between one of the power supply lines and the output side, an output signal of the inverter circuit being supplied to a gate of the second MIS transistor, an inverted signal of the control signal supplied to the gate of the first MIS transistor being supplied to a gate of the third MIS transistor.

According to the above-mentioned constitution, the transfer gate transistor which transmits the input signal supplied from the input side thereof to the output side thereof is not comprised in the CMOS form as in the above-mentioned conventional circuit, but is comprised by a single transistor (i.e., the first MIS transistor), so the chance of occurrence of latch-up as mentioned above is eliminated.

Further, when the potential of the input signal supplied to the first MIS transistor comprising the transfer gate transistor is a first level (e.g., high level), the second and third MIS transistors are turned on and the potential of the first level of the output side of the transfer gate transistor is guaranteed. On the other hand, when the potential of the input signal supplied to the first MIS transistor becomes a second level (e.g., low level), the second MIS transistor are turned off, and the potential of the second level of the input signal is transferred to the output side through the first MIS transistor.

DESCRIPTION OF THE PREFERRED EMBODIMENTS

Figure 1:
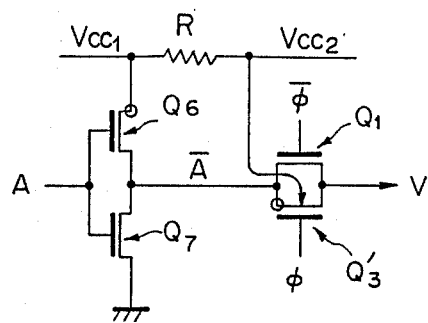
FIG. 1 is a circuit diagram showing an example of the constitution of a conventional transfer gate circuit.

In order to clarify the background of the present invention, an example of the constitution of a conventional transfer gate circuit is shown in FIG. 1. Namely, in FIG. 1, reference symbols $Q_6$ and $Q_3'$ are P-channel MOS transistors (in general, MIS transistors). These P-channel transistors are given the 0 mark in the figure. Further, $Q_7$ and $Q_1$ are N-channel MOS transistors (in general MIS transistors). The P-channel transistor $Q_6$ and N-channel transistor $Q_7$ comprise an inverter circuit. On the other hand, the P channel transistor $Q_3'$ and N channel transistor $Q_1$ comprise CMOS type transfer gate transistors. The potential of the input signal A supplied to the input side of the inverter circuit comprised of the transistors $Q_6$ and $Q_7$ is inverted by the inverter circuit. The inverted signal $\overline{A}$ is supplied to the input side of the transfer gate transistors. The gates of the transistors $Q_3'$ and $Q_1$ are supplied with control clock signal $\phi$ and its inverted signal $\overline{\phi}$. When the clock signal $\phi$ becomes the low level (therefore the inverted signal $\overline{\phi}$ becomes the high level), the transistors $Q_3'$ and $Q_1$ are turned on and the signal $\overline{A}$ having a predetermined potential supplied to the input side is transferred to the output side of the transfer gate transistors as the output potential V. Here, the reason why the transfer gate is comprised in a so-called CMOS form by the P-channel transistor $Q_3'$ and N-channel transistor $Q_1$ is that if the transfer gate were comprised only of the P-channel transistor $Q_3'$, in the low level (zero level) state of the input signal $\overline{A}$, the potential of the output side would not fall below the threshold voltage Vth ($Q_3'$) of the transistor $Q_3'$ and if the transfer gate were comprised only of the N-channel transistor $Q_1$, in the high level (level of potential $V_{CC1}$ supplied from the inverter circuit) state of the input signal $\overline{A}$, the potential of the output side would not rise above the value of the high level potential of the inverted control signal $\overline{\phi}$ minus the threshold voltage Vth ($Q_1$) of the transistor $Q_1$. On the other hand, by constructing the transfer gate in the so-called CMOS form, the low level and high level of the input signal $\overline{A}$ can be transferred as they are to the output side by the control clock signals $\phi$ and $\overline{\phi}$.

Figure 2:
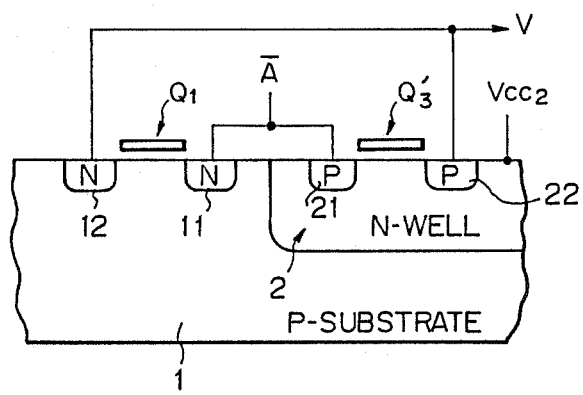
FIG. 2 is a diagram showing the state of formation of the CMOS type transfer gate transistors shown in FIG. 1 in a semiconductor substrate.

FIG. 2 shows the state of the above-mentioned transistors $Q_1$ and $Q_3'$ formed in a semiconductor substrate. In a P-type substrate 1 are formed source (drain) regions (N-type region) 11 and 12 of the N-channel transistor $Q_1$. In an N-type well 2 formed in said P-type substrate 1 are formed source (drain) regions (P-type regions) 21 and 22 of the P-channel transistor $Q_3'$. The input signal $\overline{A}$ is supplied to the N-type region 11 and the P-type region 21. By the control clock signal, these transistors $Q_1$ and $Q_3'$ are turned on, whereby the input signal $\overline{A}$ is taken out as the output potential V from the N-type region 12 and the P-type region 22. Note that the N-type well 2 in which the P-channel transistor $Q_3'$ is formed is supplied with a predetermined potential $V_{CC2}$ (as mentioned later, which is lower than $V_{CC1}$) from a power supply line which is common with the inverter circuit.

As mentioned above, the N-type well 2 in which is formed the P-channel transistor $Q_3'$ comprising the CMOS type transfer gate is supplied with the predetermined potential $V_{CC2}$ from the power supply line which is common with a circuit for production of the input signal $\overline{A}$ to be transferred (in the above-mentioned FIG. 1, the inverter circuit), but the power supply line inevitably includes a wiring resistance R. Particularly, if some circuits belonging to another system, for example, are provided between the inverter circuit and the transfer gate transistors, the length of the power supply line becomes relatively long, and accordingly, the value of the wiring resistance R becomes relatively high. Further, when the power current is supplied to some peripheral circuits (not shown) provided on the same substrate through the power supply line, the value of the power current flowing through the power supply line also becomes high. Therefore, in such a case, relatively large potential difference occurs between the potential $V_{CC1}$ supplied from the power supply line to the inverter circuit and the potential $V_{CC2}$ supplied from the power supply line to the N-type well. The potential $V_{CC2}$ therefore becomes lower than the potential $V_{CC1}$ (that is, $V_{CC1} > V_{CC2}$).

On the other hand, as the current flowing through the signal line is small the high level potential of the input signal $\overline{A}$ supplied to the transfer gate transistors is nearly equal to the high level potential $V_{CC1}$ supplied from the inverter circuit, so in the high level state of the input signal $\overline{A}$, a PN junction turns on between the source (or drain) of the P-channel transistor $Q_3'$ to which the potential $V_{CC1}$ is supplied and the N-type well 2 to which the potential $V_{CC2}$ is supplied. Due to this, there is a chance of occurrence of so-called latch-up by the thyristor equivalently comprised by the PNPN layers formed in the semiconductor substrate. In such a case, subsequent to this, there is the problem that current will continue to flow in the semiconductor substrate through the PNPN layers.

Figure 3:
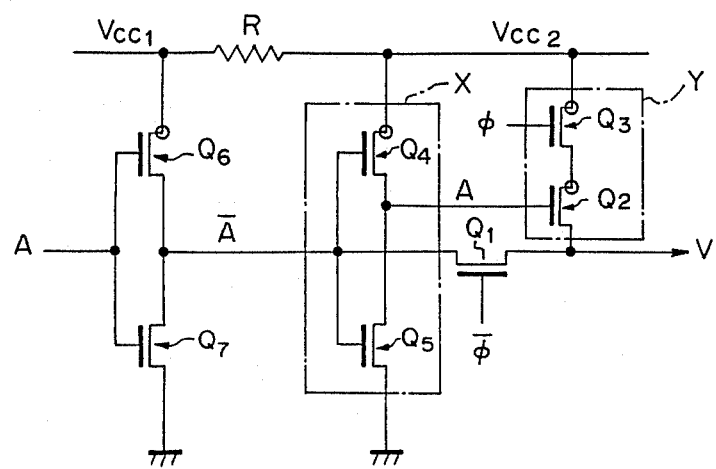
FIG. 3 is a circuit diagram showing the constitution of a transfer gate circuit according to a first embodiment of the present invention.

The present invention was made to solve this problem, and FIG. 3 shows the constitution of a transfer gate circuit according to a first embodiment of the present invention, in which portions corresponding to those in FIG. 1 are given the same reference symbols as in FIG. 1. In FIG. 3, $Q_2$, $Q_3$, $Q_4$, and $Q_6$ are P-channel MOS transistors (in general, MIS transistors), which P-channel transistors are given the O mark in the figure. Further, $Q_1$, $Q_5$, and $Q_7$ are N channel MOS transistors (in general, MIS transistors).

The P-channel transistor $Q_6$ and N-channel transistor $Q_7$ comprise an inverter circuit (corresponding to the inverter circuit in FIG. 1). An input signal $\overline{A}$ is supplied from the output side of the inverter circuit to the N-channel transistor $Q_1$ comprising the transfer gate. When the control clock signal $\overline{\phi}$ supplied to the gate of the transistor $Q_1$ becomes the high level, the potential of the input signal $\overline{A}$ is transferred to the output side of the transfer gate as the output potential V.

Between the power source line, which is common with the inverter circuit, and the output side of the transfer gate transistor $Q_1$ are connected in series two P-channel (that is, conductivities opposite to the above-mentioned N-channel transistor $Q_1$) transistors $Q_2$ and $Q_3$. To the gate of the transistor $Q_2$ is supplied a signal A, inverted by an inverter circuit X comprised of the transistors $Q_4$ and $Q_5$, from an input signal $\overline{A}$ supplied to the N-channel transistor $Q_1$. On the other hand, a clock signal $\phi$, inverted from a control clock signal $\overline{\phi}$ supplied to the gate of the N-channel transistor $Q_1$, is supplied to the gate of the transistor $Q_3$. Here, these two transistors $Q_2$ and $Q_3$ comprise an output level guarantee circuit Y, so the high level potential transferred to the output side of the transfer gate (N-channel transistor $Q_1$) is guaranteed by the output level guarantee circuit Y.

In such a transfer gate circuit of the present invention described above, since the transfer gate is comprised by a signal transistor (that is, the N-channel transistor $Q_1$ in the case of FIG. 3), even if a potential difference occurs based on the above wiring resistance R and the power current flowing through the above-mentioned power supply line, the chance of occurrence of the above-mentioned latch-up as in the conventional circuit comprised of the CMOS type transfer gate is completely eliminated.

Further, at the high level state of the input signal $\overline{A}$ (that is, the $V_{CC1}$ level), when the control clock signal $\overline{\phi}$ becomes the high level, it is not possible to transfer the predetermined high level potential as mentioned above by just the above-mentioned N-channel transistor $Q_1$, but in the present invention, both the inverted signal A supplied to the gate of the transistor $Q_2$ and the inverted signal $\phi$ supplied to the gate of the transistor $Q_3$ become low level, both the P-channel transistor $Q_2$ and $Q_3$ are turned on, and the potential of the output side of the transfer gate transistor $Q_1$ is made the $V_{CC2}$ level, which can substantially be estimated as a high signal level. Namely, when considering the signal level, it is possible to ignore the potential difference caused by the abovementioned power supply line and the high level potential of the transfer destination is guaranteed to be made the high level potential of $V_{CC2}$ which can be estimated as the high signal level.

On the other hand, in the low level state of the input signal $\overline{A}$ (that is, the zero level), when the control clock signal $\overline{\phi}$ becomes the high level and the transistor $Q_1$ is turned on, the transistor $Q_2$ is turned off and the low level potential of the transfer destination is made equal to the ground potential through the transistor $Q_1$ and the transistor $Q_7$.

Note that in the illustrated embodiment, the inverter circuit X for supplying the above-mentioned inverted signal A to the gate of the transistor $Q_2$ is connected to the input side of the transistor $Q_1$, but the inverter circuit X clearly may also be connected to the output side of the transistor $Q_1$.

Further, in the illustrated embodiment, the transistor $Q_1$ comprising the transfer gate was made an N-channel transistor, but the transistor $Q_1$ may also be made a P-channel transistor, in accordance with which the transistors $Q_2$ and $Q_3$ are made N-channel transistors and these transistors $Q_2$ and $Q_3$ are connected in series between the output side of the transistor $Q_1$ and the ground, whereby it is possible to supply a predetermined gate signal to these transistors $Q_2$ and $Q_3$, in the similar way as above and to guarantee the low level potential of the transfer destination.

Figure 4:
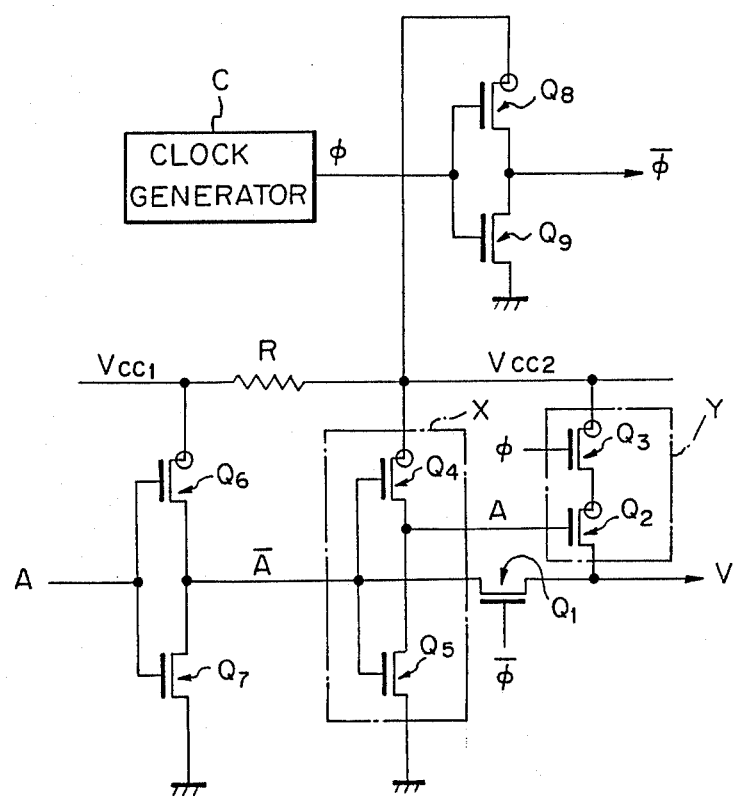
FIG. 4 is a circuit diagram showing the constitution of a transfer gate circuit according to a second embodiment of the present invention.

FIG. 4 shows the constitution of a transfer gate circuit according to a second embodiment of the present invention. In this embodiment, a P-channel MOS transistor $Q_8$ and an N-channel MOS transistor $Q_9$ (in general, MIS transistors) comprise another inverter circuit for supplying the inverted clock signal $\overline{\phi}$ of the clock signal $\phi$ generated from a clock generator C to the gate of the transfer gate transistor $Q_1$. Note that in the transfer gate circuit shown in FIG. 4, portions corresponding to those in FIG. 3 are given the same reference symbols as in FIG. 3. In this connection, a source side of the P-channel transistor $Q_8$ is connected to the power supply line at the connecting point adjacent to that of the above inverter circuit X (i.e., the connecting point having the potential level substantially equal to $V_{CC2}$). In this connection, if the potential of the control clock signal $\overline{\phi}$ becomes high level, which is higher than a predetermined level from one cause or another (e.g., if the potential level of the clock signal $\overline{\phi}$ becomes the above $V_{CC1}$ plus the above threshold voltage Vth ($Q_1$), and the output potential V becomes equal to $V_{CC1}$ which is higher than $V_{CC2}$), there is a chance of occurrence of the latch-up of the P-channel transistor $Q_2$ provided in the output level guarantee circuit Y.

In more detail, the potential level of a drain region of the P-channel transistor $Q_2$ is equal to the value V, an N-type well (not shown) in which the P-channel transistor $Q_2$ is formed is supplied with the potential $V_{CC2}$, and therefore, if the potential of the control signal $\overline{\phi}$ becomes higher than the predetermined level as abovementioned, the latch-up of the transistor $Q_2$ may occur, as in the case of the latch-up of the above-mentioned P-channel transistor $Q_3'$ provided in the circuit shown in FIG. 1.

However, in the above circuit shown in FIG. 4, the potential level of $\overline{\phi}$ is set to be equal to $V_{CC2}$ in high level side (i.e., when the P-channel transistor $Q_8$ having the source connected to the power supply line at the point having the potential level substantially equal to $V_{CC2}$ is turned on and the N-channel transistor $Q_9$ is turned off). Thus, the output potential V (i.e., the potential level $\overline{\phi}$ minus the threshold voltage Vth ($Q_1$)) becomes equal to ($V_{CC2}$−Vth ($Q_1$)), and as a result, the output potential V become lower than $V_{CC2}$. Therefore, according to the circuit shown in FIG. 4, it is possible to surely prevent the occurrence of the latch-up of the P-channel transistor $Q_2$ provided in the output level guarantee circuit Y.

As above-mentioned, according to the present invention, it is possible to obtain a transfer gate circuit which inhibits the chance of occurrence of latch-up as in the conventional CMOS type transfer gate circuit and further enables reliable transfer of the input signal supplied from the input side thereof to the output side thereof in accordance with the potential level of the control clock signal supplied to the single transfer gate transistor.

We claim:

1. A transfer gate circuit comprising:
   an inverter circuit connected between power supply lines, said inverter circuit having an input signal input thereto, said inverter circuit inverting a potential of said input signal and outputting said inverted input signal at an output thereof;
   a first MIS transistor having an input, an output and a gate, said input thereof being connected to an input of said inverter circuit, said first MIS transistor transmitting said input signal from said input thereof to said output thereof according to a control signal supplied to said gate; and
   an output level guarantee circuit, said output level guarantee circuit including second and third MIS transistors of a conductivity type opposite to said first MIS transistor, said second and third MIS transistors being connected in series between said power supply lines and said output of said first MIS transistor, said output of said inverter circuit being supplied to a gate of said second MIS transistor, and an inverted signal of said control signal, supplied to the gate of said first MIS transistor, being supplied to a gate of said third MIS transistor.

2. A transfer gate circuit according to claim 1, further comprising another inverter circuit for supplying said control signal to the gate of said first MIS transistor, said another inverter circuit being connected between said power supply lines, said one of power supply lines having high potential level being connected to said another inverter circuit at the connecting point adjacent to that of said inverter circuit.

3. A transfer gate circuit according to claim 1, wherein said first MIS transistor is an N-channel type transistor, and said second and third MIS transistors are P-channel type transistors connected in series between said one of power supply lines having high potential level and said output side of said first MIS transistor.

4. A transfer gate circuit according to claim 1, wherein said first MIS transistor is a P-channel type transistor, and said second and third MIS transistors are N-channel type transistors connected in series between said output side of said first MIS transistor and said one of power supply lines having low potential level.

5. A transfer gate circuit according to claim 1, wherein said input signal of said inverter circuit is input from said input of said first MIS transistor.

6. A transfer gate circuit according to claim 1, wherein said input signal of said inverter circuit is input from said output of said first MIS transistor.

7. A transfer gate circuit according to claim 2, wherein said first MIS transistor is an N-channel type transistor, and said second and third MIS transistors are P-channel type transistors connected in series between said one of power supply lines having high potential level and said output side of said first MIS transistor.

8. A transfer gate circuit according to claim 2, wherein said first MIS transistor is a P-channel type transistor, and said second and third MIS transistors are N-channel type transistors connected in series between said output side of said first MIS transistor and said one of power supply lines having low potential level.

9. A transfer gate circuit according to claim 2, wherein said input signal of said inverter circuit is input from said input of said first MIS transistor.

10. A transfer gate circuit according to claim 2, wherein said input signal of said inverter circuit is input from said output of said first MIS transistor.

* * * * *